(12) United States Patent
Petkov et al.

(10) Patent No.: US 10,099,241 B2
(45) Date of Patent: Oct. 16, 2018

(54) SYSTEM AND METHOD FOR DEPOSITING A MATERIAL ON A WORKPIECE

(71) Applicant: Milara Incorporated, Milford, MA (US)

(72) Inventors: Krassimir D. Petkov, Medway, MA (US); Velimir Deric, Franklin, MA (US); Stephen K. Brodeur, Blackstone, MA (US)

(73) Assignee: Milara Incorporated, Milford, MA (US)

(*) Notice: Subject to any disclaimer, the term of this patent is extended or adjusted under 35 U.S.C. 154(b) by 0 days.

(21) Appl. No.: 15/266,530

(22) Filed: Sep. 15, 2016

(65) Prior Publication Data

US 2017/0072424 A1    Mar. 16, 2017

Related U.S. Application Data

(60) Provisional application No. 62/218,803, filed on Sep. 15, 2015.

(51) Int. Cl.
*B41F 15/08* (2006.01)
*B41F 15/40* (2006.01)
(Continued)

(52) U.S. Cl.
CPC ............... *B05C 11/04* (2013.01); *B05D 1/40* (2013.01); *B41F 15/0818* (2013.01);
(Continued)

(58) Field of Classification Search
CPC ...... B05C 11/04; B41F 15/08; B41F 15/0881; B41F 15/0818; B41F 15/40; B41F 15/42;
(Continued)

(56) References Cited

U.S. PATENT DOCUMENTS 5,254,362 A * 10/1993 Shaffer ............... H05K 3/1233
                                                        118/258
5,522,929 A    6/1996 Erdmann
(Continued)

OTHER PUBLICATIONS

International Search Report, PCT/US2016/051856, dated Jan. 2, 2017, 12 pages.

*Primary Examiner* — Leslie J Evanisko
(74) *Attorney, Agent, or Firm* — Nelson Mullins Riley & Scarborough LLP; Anthony A. Laurentano

(57) ABSTRACT

A manufacturing system for applying a material to a workpiece comprising a blade unit having a blade element for selectively moving along first and second axes for applying the material to the workpiece. A reciprocating motor is coupled to the blade unit for reciprocating the blade element along the first axis concurrent with movement of the blade element along the second axis, and a vibration detector is coupled to the blade unit for detecting the vibrational movement of the blade element. The vibration detector generates an output signal corresponding to the vibrational movement of the blade element. A control unit is coupled to the vibration detector for generating an output signal in response to the vibration detector signal, and a regulating device adjusts a parameter of the reciprocating motor in response to the output signal of the control unit.

20 Claims, 3 Drawing Sheets

(51) Int. Cl.
  *B05C 11/04*    (2006.01)
  *B05D 1/40*     (2006.01)
  *H05K 3/40*     (2006.01)
  *H05K 3/32*     (2006.01)
  *B41F 15/42*    (2006.01)
  *H05K 3/12*     (2006.01)
  *H05K 13/04*    (2006.01)
  *H05K 13/08*    (2006.01)

(52) U.S. Cl.
  CPC .......... *B41F 15/0881* (2013.01); *B41F 15/42* (2013.01); *B41F 15/423* (2013.01); *H05K 3/1216* (2013.01); *H05K 3/1233* (2013.01); *H05K 3/32* (2013.01); *H05K 3/40* (2013.01); *H05K 13/0465* (2013.01); *H05K 13/0469* (2013.01); *H05K 13/08* (2013.01); *B41P 2215/132* (2013.01); *H05K 2203/0139* (2013.01); *H05K 2203/04* (2013.01)

(58) Field of Classification Search
  CPC ........ B41F 15/423; B41F 15/44; B41F 15/46; B41P 2215/132
  USPC ........................................................ 101/123
  See application file for complete search history.

(56) References Cited

U.S. PATENT DOCUMENTS 5,738,904 A * 4/1998 Jones ................ B41M 1/12
                                                  101/123
2012/0042795 A1   2/2012 Walker \* cited by examiner

SYSTEM AND METHOD FOR DEPOSITING A MATERIAL ON A WORKPIECE

RELATED APPLICATION

This application claims priority to U.S. provisional patent application Ser. No. 62/218,803, filed Sep. 15, 2015, and entitled SYSTEM AND METHOD FOR DEPOSITING A MATERIAL ON A WORKPIECE, the contents of which are herein incorporated by reference.

FIELD OF THE INVENTION

The present invention relates generally to an apparatus and method for the manufacture of electrical circuit devices and, more particularly, to an apparatus and method for depositing a conductive mounting material through an apertured mask with high fidelity onto a printed circuit board (PCB).

BACKGROUND OF THE INVENTION

A common technique for manufacturing PCBs employs surface mount technology, where components are secured to conductive pads on the surface of the circuit board. Conductive paths in or on the circuit board interconnect the pads. Components are affixed to these pads by conductive or non-conductive mounting materials, referred to hereinafter as mounting materials. These mounting materials are compounds with preferably both adhesive and electrical conduction properties, and can include materials such as solder paste and conductive epoxy. Solder paste is a viscous paste that includes finely ground solder particles in a flux base. Conductive epoxies are organic compounds which have adhesive properties sufficient to secure electrical components to circuit boards and which are electrically conductive. A variety of conductive epoxies are available, for example, from Epoxy Technology, Inc., Billerica, Mass.

In one known practice, solder paste is printed onto a circuit board through an apertured mask placed in selected registration over the circuit board. A material-applying sweep by a suitable blade, such as a squeegee-like blade, across the mask applies the solder paste to the circuit board in a pattern reflective of the apertures in the mask. Generally, the application of solder paste, or other mounting material, to a circuit board occurs with a single sweep of the blade. The use of multiple sweeps, or multiple blades, is commonly deemed undesirable. After each sweep of the blade, the processed circuit board is removed and replaced with a fresh board. After applying solder paste to the circuit board, leads of various electronic components are placed on the PCB at the sites bearing the solder paste. The solder paste is then heated and allowed to cool, thereby securing the components to the board and connecting them electrically to the conductive runs in the board.

A considerable problem in PCB production relates to the fidelity of applying the mounting material. Fidelity, as used herein, includes resolution, reproducibility and definition. Herein, resolution refers to the minimum distance between two adjacent mask apertures capable of ensuring no inadvertent contact between mounting material sites on the circuit board. Reproducibility refers to the maximum variation in mounting material patterns between any two PCBs produced with the same mask. Definition refers to the precision with which the mounting material pattern reflects the aperture pattern of the mask. Common fidelity problems include, for example, contamination of the mask bottom with mounting material and void spaces in the mounting material deposited on the circuit boards. Void spaces in the deposited mounting material become increasingly pronounced with decreasing size of the mask apertures. Fidelity problems are of significant concern with PCBs designed to accommodate high densities of components, since minute errors in mounting material placement can potentially render these boards useless. Fidelity limitations presently determine the maximum allowable density of PCB components. Increasing the fidelity of mounting material application will allow for the low cost, mass production of PCBs with higher densities of components than is presently possible.

Prior art attempts to increase the fidelity of the mounting material application process include increasing the pressure exerted by the blade upon the mask, using slow blade sweep rates, and using angular blade sweeps across the mask. Each of these techniques suffers from disadvantages. Increased blade pressure decreases mask life, increases blade wear, and scavenges mounting material from mask apertures. Scavenging of mounting material occurs when the blade, during the sweep, dips into an aperture and scoops out material from that aperture. Other PCB production problems amplified by increased blade pressures are "screen stretch" and contamination of the mask bottom with mounting material. "Screen stretch" is caused by friction between the blade and the mask, which stretches the mask in the direction of the sweep. Contamination of the bottom of the mask with mounting material results in mounting material being applied outside the desired mask pattern and requires cleaning of the mask.

Slow blade movement across the mask may somewhat increase the resolution and definition of mounting material deposition, however, it increases the time to process each circuit board and hence reduces manufacturing rates and increases costs.

The use of an angular sweep to spread mounting material across a mask has also been employed in an effort to increase the fidelity of mounting material application. One application of this method involves sweeping a blade, which is set at an angle relative to the sweep direction, down the length of the mask so that the blade passes over the mask apertures, which generally are placed on X and Y axes, at oblique angles. This method of applying mounting material, however, is impractical for the mass production of PCBs due to spacial constraints. To prevent shifting of the mask in a typical current practice, a four-sided frame of minimal size holds the mask tightly in place by securing it on all four sides. As such, when a blade makes an angular sweep, limitations on available space result in solder paste not being applied to two corners of the mask surface. Further, this conventional technique also leads to inconsistent results especially when using fine pitch pads that are disposed perpendicular to each other. The length of the sweep stroke is also lengthened considerable.

In order to address these and other issues, the assignee hereof invented a method whereby a vibrating force was applied to the blade during use. An example of this method is described and illustrated in U.S. Pat. No. 5,522,929 of Erdmann, the contents of which are herein incorporated by reference. As described therein, the blade oscillates along a single axis that is generally transverse to a sweep direction. The blade thus travels in a zig-zag motion along this axis, and is an effective method for evenly filling and leveling stencil or mask apertures. A drawback of this method is that the frequency of the blade oscillation is fixed during use.

SUMMARY OF THE INVENTION

Accordingly, one objective of the present invention is to provide an apparatus and a method that increases the fidelity of mounting material application in circuit board manufacturing. A particular objective is to more accurately control the vibrational energy generated by the blade unit. A further object is to increase the production rate of circuit boards by increasing the allowable sweep rate of the blade across the mask. An additional object is to reduce scavenging of mounting material by the blade.

The present invention is directed to a system that allows accurate and precise control of a reciprocating motor by detecting the vibration of a blade unit via a vibration detector, and then using this information to control, adjust or vary one or more selected parameters, such as air pressure, supplied to the motor.

The present invention is particularly directed to a printed circuit manufacturing system for applying an extrudable mounting material through a selectively apertured mask. The system comprises a blade unit having a blade element that is elongated along a first axis and has a thickness along a transverse second axis, a reciprocating motor that is coupled to the blade unit for reciprocating the blade element along the first axis concurrent with movement of the blade element along the second axis, and a vibration detector coupled to the blade unit for detecting the vibrational movement of the blade element. The vibration detector generates an output signal corresponding to the vibrational movement of the blade element. The vibration detector can be an accelerometer. The system also includes an air control unit that is coupled to the reciprocating motor for adjusting the amount of air pressure supplied to the motor, and a control unit coupled to the vibration detector and to the air control unit for generating an output signal in response to the output signal of the vibration detector to control the air control unit. The air control unit in response to the output signal of the control unit adjusts a selected parameter, such as frequency, of the reciprocating motor by controlling a selected parameter, such as air pressure, of the reciprocating motor. The air control unit can be a proportional air valve.

The blade unit of the invention can include a non-reciprocating bearing mount coupled to a sweep arm, a reciprocating blade holder coupled to the bearing mount and to the blade element, and a bearing assembly mounting said reciprocating blade holder to the bearing mount by providing relative movement therebetween along the first axis.

According to the present invention, the reciprocating motor comprises a pneumatic vibrator, a pneumatic transducer, a piezoelectric actuator, or an electric motor.

According to another practice, the present invention is directed to a manufacturing system for applying a material to a workpiece through an apertured mask. The system includes a blade unit having a blade element elongated along a first axis and having a thickness along a transverse second axis and selectively movable along at least each of the first and second axes, wherein the blade element, during such movement along the second axis, transfers the material through the apertured mask onto the workpiece. The system also includes a reciprocating motor coupled to the blade unit for reciprocating the blade element along the first axis concurrent with movement of the blade element along the second axis and a vibration detector coupled to the blade unit for detecting the vibrational movement of the blade element. The vibration detector generates an output signal corresponding to the vibrational movement of the blade element. The system further includes a control unit coupled to the vibration detector for generating an output signal in response to the output signal of the vibration detector, and a regulating device coupled to the reciprocating motor and to the control unit for adjusting a parameter of the reciprocating motor in response to the output signal of the control unit.

The material employed by the present invention is a conductive extrudable mounting material, and the workpiece is a printed circuit board. Further, the control unit generates the output signal in accordance with a set of pre-stored instructions, and the reciprocating motor comprises a pneumatic vibrator, a pneumatic transducer, a piezoelectric actuator, or an electric motor. The vibration detector of the present invention can be an accelerometer.

According to another aspect, the parameter of the reciprocating motor adjusted by the control unit comprises a frequency of vibration or amplitude of vibration. Further, the regulating device comprises an air control unit for adjusting the amount of air pressure supplied to the reciprocating motor. The air control unit in response to the output signal of the control unit adjusts a frequency of vibration of the reciprocating motor by controlling the air pressure supplied to the reciprocating motor.

The present invention is also directed to a method of applying a material to a workpiece through an apertured mask, the method comprising providing a blade unit having a blade element elongated along a first axis and having a thickness along a transverse second axis and selectively movable along at least each of the first and second axes, wherein the blade element, during such movement along the second axis, transfers the material through the apertured mask onto the workpiece, reciprocating the blade element along the first axis via a reciprocating motor concurrent with movement of the blade element along the second axis, detecting the vibrational movement of the blade element and generating a vibrational output signal corresponding to the vibrational movement of the blade element, generating a control output signal in response to the output signal of the vibration detector, and adjusting a parameter of the reciprocating motor in response to the control output signal.

According to the one practice, the method includes generating the control output signal in accordance with a set of pre-stored instructions. Further, the parameter of the reciprocating motor comprises a frequency of vibration or an amplitude of vibration.

According to another practice, the adjusting step is performed by a regulating device coupled to the reciprocating motor, wherein the regulating device comprises an air control unit for adjusting the amount of air pressure supplied to the reciprocating motor. The air control unit in response to the control output signal generated by a control unit adjusts a frequency of vibration of the reciprocating motor by controlling the air pressure supplied to the reciprocating motor.

BRIEF DESCRIPTION OF THE FIGURES

These and other features and advantages of the present invention will be more fully understood by reference to the following detailed description in conjunction with the attached drawings in which like reference numerals refer to like elements throughout the different views. The drawings illustrate principals of the invention and, although not to scale, show relative dimensions.

DETAILED DESCRIPTION

The present invention provides a circuit board manufacturing system for manufacturing circuit boards by applying a mounting material thereto. The system of the invention helps reduce the amount of particulates that enters the mechanical housing. The present invention will be described below relative to the illustrated embodiment(s). Those skilled in the art will readily appreciate that the present invention may be implemented in a number of different applications and embodiments and is not specifically limited in its application to the particular embodiment depicted herein.

The invention attains the foregoing objects by providing a machine that has an elongated squeegee-like blade element that wipes across an apertured mask to apply to a printed circuit board, or other substantially flat circuit element, a conductive or non-conductive mounting material. The apparatus and method of the invention involve reciprocating the blade element back and forth transverse to the direction of the blade sweep across the mask, during the material-applying sweep of the blade element across the mask. One or more parameters of the reciprocating motor, such as the frequency of vibration or oscillation, can be adjusted, varied or regulated in real time during the sweep process by controlling, varying or regulating a selected input parameter, such as air pressure. As used herein, sweep refers to the material-depositing movement of the blade element across the mask surface, and commonly involves a continuous linear motion.

The reciprocating motion of the blade element, during the material-applying sweep, enhances the fidelity of material deposition without increasing the pressure of the blade on the mask and without reducing sweep rates. The reciprocating motion of the blade element, during the sweep movement, is believed to subject the mounting material to new degrees of shear stress which enhances the deposition of the material through the mask apertures with high fidelity and with minimal voids, even when the openings in the mask are exceedingly small. The fidelity of the application of the mounting material can be further enhanced if the frequency of the vibration of the blade is regulated in real time.

Figure 1:
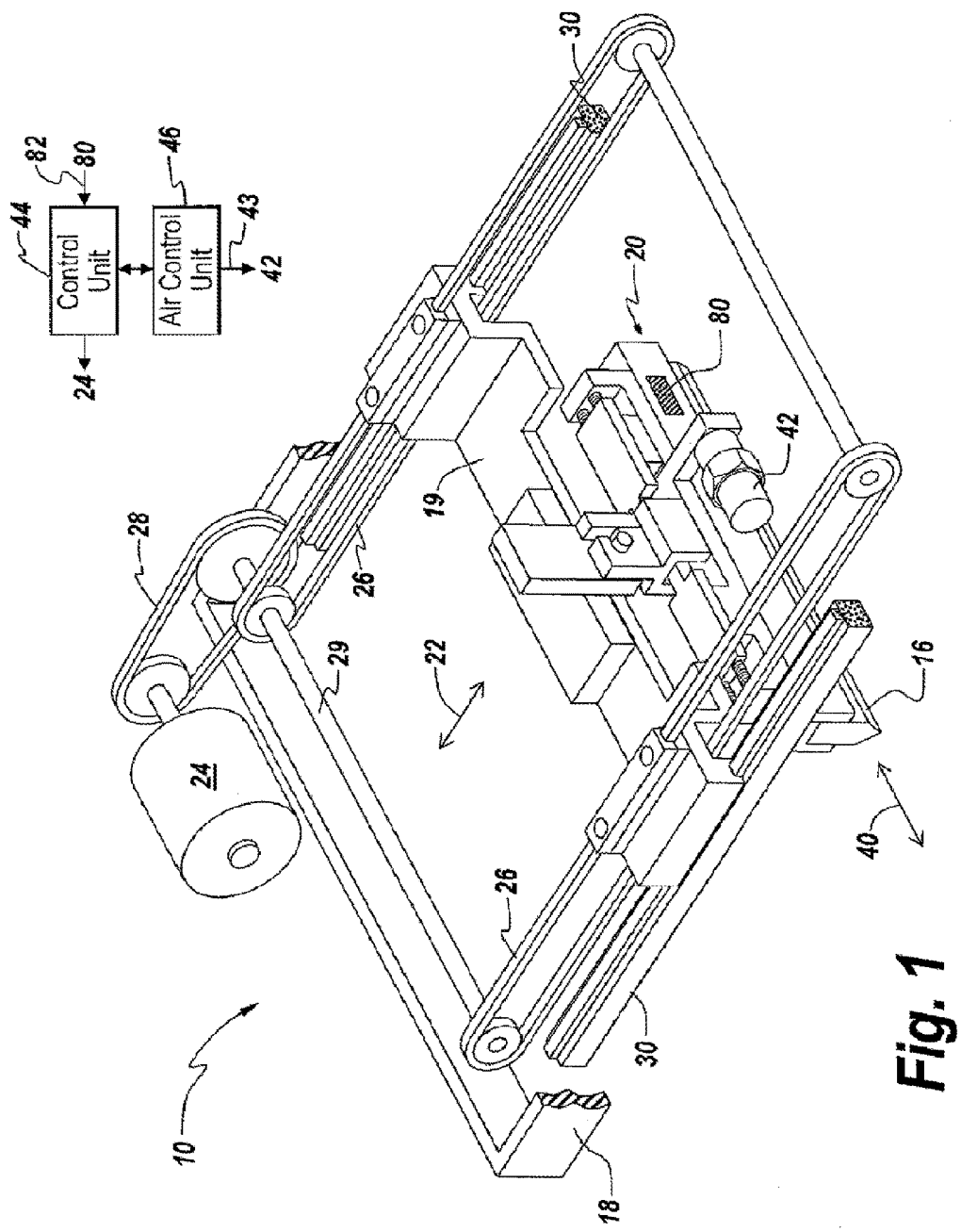
FIG. 1 is a perspective view of a portion of the circuit board manufacturing system of the present invention.
Figure 2:
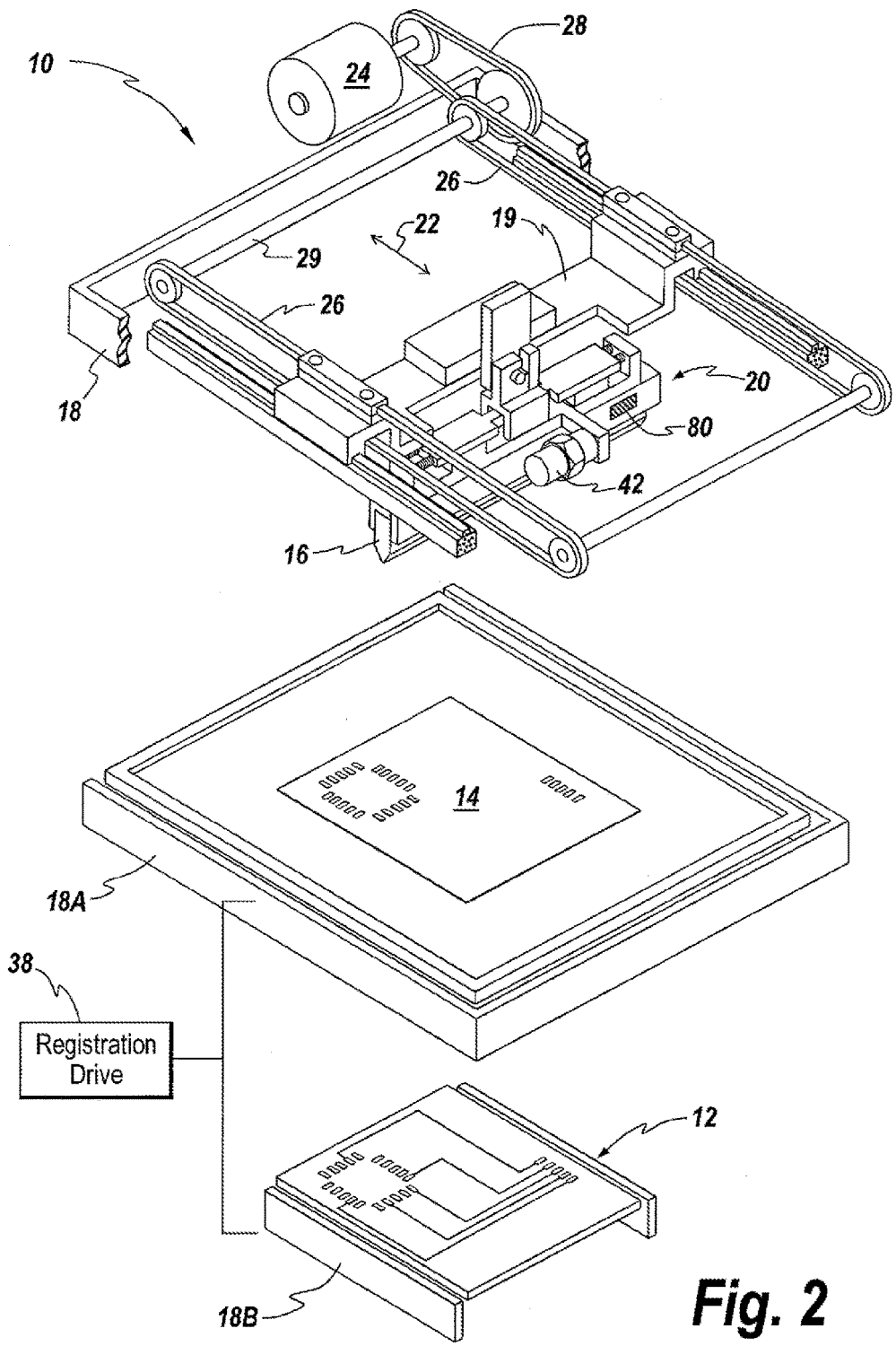
FIG. 2 is a fragmentary exploded view, in perspective, of a circuit board manufacturing system according to the teachings of the present invention. The registration drive and the control elements for the sweep drive and the reciprocating motor are shown in block form.
Figure 3:
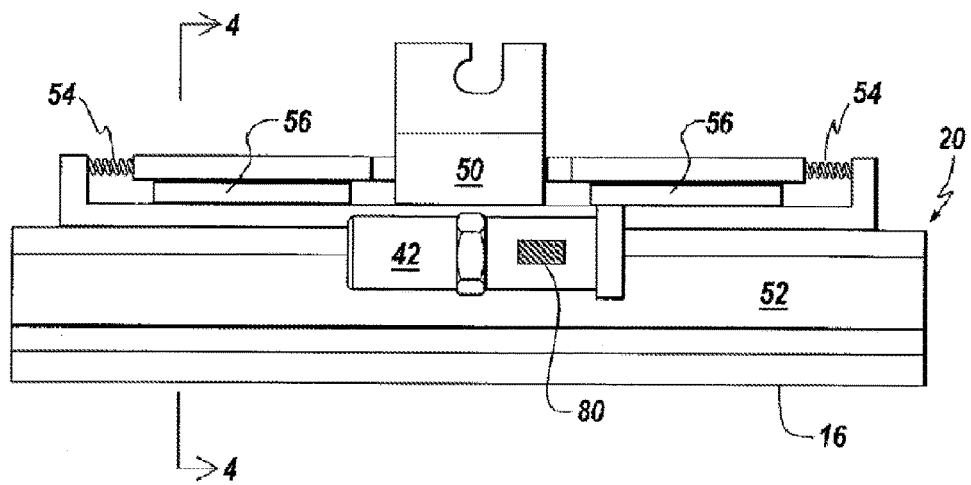
FIG. 3 is a frontal elevation view of the blade unit of the system of FIG. 1.
Figure 4:
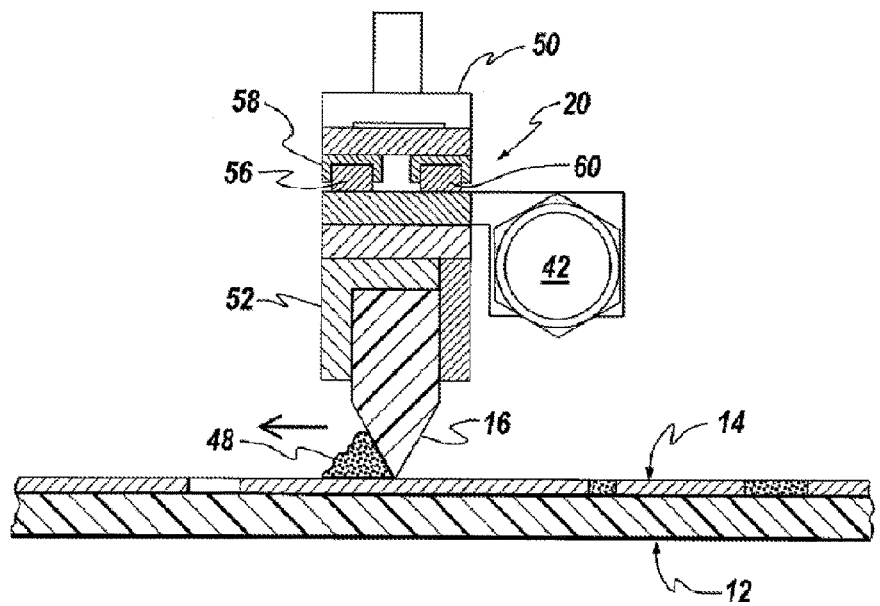
FIG. 4 is a cross-sectional view of the blade unit according to the teachings of the present invention and taken along section line 4-4 of FIG. 3. The blade element of the blade unit is shown as applying an extrudable material to a circuit board.

FIGS. 1, 2 and 4 show a circuit board manufacturing system 10 according to the present invention for applying a conductive or non-conductive mounting material 48 to a workpiece or substrate, such as a circuit board 12, through preferably an apertured mask 14 by movement of a blade element 16 across the mask surface. The illustrated circuit board manufacturing system 10 performs one of many steps in the manufacturing of circuit boards 12, namely, applying extrudable mounting material to a circuit board 12. Those of ordinary skill will readily recognize that the substrate can be formed from different materials and can vary in shape and size. For example, the substrate can be a silicon wafer or a semiconductor wafer of different shapes and sizes, such as round, square, rectangular, and continuous sheet geometries.

The system 10 has a blade and motor support assembly that can include a pair of substantially parallel guide rails 30 mounted to a machine frame element 18. A sweep arm 19 is secured to the machine frame 18 by the guide rails 30. The sweep arm 19 is configured and adapted to slide along the length of the guide rails 30 during use and carries the blade and motor unit 20 in the direction of the arrow 22. The guide rails 30 allow for the sweeping motion of the sweep arm 19 back and forth across the surface of the apertured mask 14 in the sweep direction, indicated by arrow 22. Thus, the sweep arm 19 can move along the rails 30 in the sweep direction across the surface of the apertured mask 14 with a continuous linear motion.

The motion of the sweep arm 19 is controlled by a sweep drive 24. The sweep drive 24, typically an electric motor, is coupled to a sweep drive belt 28 which, in turn, is coupled to a drive shaft 29. The drive shaft 29 is coupled to a pair of opposed blade unit drive belts 26, 26 that connect directly to the sweep arm 19. Thus, the driving action of the sweep drive 24 is translated into linear motion of the sweep arm 19 through the sweep belt drive 28, the drive shaft 29 and the blade unit drive belts 26, 26.

The apertured mask 14 and the circuit board 12 are each removably and replaceably held in frame sections 18A and 18B, respectively. The frame sections 18A and 18B support a circuit board 12 in a plane parallel to the apertured mask 14. A registration drive 38 selectively provides precision control movement of one frame section relative to the other to align the circuit board 12 precisely with, and in abutment with, the apertured mask 14. Registration drives are known in the art and may consist of registration pins placed in frame section 18A and corresponding apertures placed in frame section 18B. The pins of frame section 18A fit only within their respective apertures in frame section 18B, thereby correctly aligning the apertures in the mask 14 with surface mount pads on the circuit board 12. Alternatively, registration drives may consist of sensing and mechanical elements. The sensing element, for example an optical unit, determines the alignment of the circuit board 12 with the apertured mask 14 and directs the mechanical element to place the board and the mask in selected registration. This selected registration between the circuit board 12 and the apertured mask 14 is such that the extrudable conductive mounting material 48 is applied, during a material-applying sweep of the blade element 16, through the mask apertures to locations on the circuit board 12 corresponding to surface mount pads.

As further shown in FIGS. 1-4, the blade unit 20 includes a non-reciprocating blade mount 50 and a reciprocating blade holder 52, to which the blade element 16 is attached. The blade mount 50 attaches firmly and securely to the sweep arm 19 for movement with it along the sweep direction 22. The mounting of the sweep arm 19 with the frame rails 30 holds the arm 19, and correspondingly the mount 50, essentially stationary with respect to movement along the transverse axis 40.

The blade holder 52 is attached to and mounted with the mount 50 for movement with it along the sweep axis 22 and is free to undergo transverse movement, i.e. movement along the transverse axis 40. The blade holder 52 is attached to the blade mount 50 by a pair of suitable biasing elements, such as restoring springs 54, and by linear bearings 56. According to one practice, a pair of springs is disposed on each side of the blade holder 52. The restoring springs are aligned parallel to the transverse axis 40. Each spring is interposed between transversely opposite ends of the mount 50 and of the holder 52. The linear bearings 56 consist of a non-reciprocating track 58 on the blade mount 50 and a reciprocating rail 60 on the blade holder 52. The linear bearing 56 attaches the blade holder 52 to the blade mount 50 while allowing for a sliding action of the blade holder 52 transverse to the sweep direction. The blade element 16 is elongated along a first axis indicated by arrow 40 and has a thickness along a transverse second axis (arrow 22) and is selectively movable along the first and second axes.

The blade unit 20 can further include a vibrating or reciprocating motor 42 that reciprocates the blade unit containing the blade element 16 back and forth in a direction transverse to the sweep direction 22 as indicated by the arrow 40. That is, the illustrated reciprocating motor 42 applies to the blade holder 52 vibrational energy directed back and forth along the transverse axis 40. The reciprocating motor can be any type of suitable drive mechanism which the control unit 44 can regulate and which is capable of reciprocating the blade element substantially transverse to the sweep direction. Examples of suitable motors include a pneumatic vibrator or transducer, a piezoelectric actuator, an electric motor and the like. One example of a pneumatic vibrator suitable for use with the present invention is marketed by Martin Vibration Systems and Solutions, USA. The vibrating motor preferably allows the operator to control one or more parameters of the motor, such as the frequency of the vibration or the amplitude of the vibration. These features can be controlled separately or independently or can be controlled together or simultaneously.

According to the present invention, one or more vibration detectors 80 can be mounted or coupled to the blade unit 20. The vibration detector can be for example an accelerometer. The vibration detector is adapted to sense or detect the vibration of the blade unit 20 and hence sense or detect the vibration of the blade element 16. The vibration detector 80 detects the vibration of the blade unit and generates an output signal 82 (FIG. 1) that is received by the control unit 44. The control unit 44 processes the output signal and according to a set of pre-stored instructions generates an output signal that is received by a regulating device, such as the air control unit 46. The air control unit 46 in response generates an output signal 43 that is received by the reciprocating motor 42 that is capable of adjusting or varying one or more parameters of the reciprocating motor, such as the frequency of vibration or the amplitude of the vibrational force generated by the motor. This allows the control unit 44 to adjust, vary, regulate or control the reciprocating frequency of the blade unit 20 in real time during use. This enables the system to apply mounting material to the PCB with high fidelity. The vibration detector 80 can include any suitable structure for detecting or sensing vibration or reciprocating movement of one or more elements of the blade unit, and can include for example an accelerometer.

According to the present invention, the control unit 44 can be programmed so as to regulate, adjust, control or vary the rate of reciprocation of the blade element 16 (e.g., vibration) and/or the length of the reciprocation stroke by controlling a selected input parameter of the reciprocating motor 42. According to one practice, the air pressure or flow generated by the air control unit 46 and passed through a suitable air line (not shown) is adjusted, controlled or regulated by the control unit 44. The air pressure of the air control unit is introduced to the reciprocating motor 42. The rate of reciprocation of the blade element 16 and/or the length of the reciprocation stroke can vary with the air pressure delivered to the reciprocating motor.

The control unit 44 is also connected to the sweep drive 24 to coordinate the transverse blade movement with the sweep movement. The control unit can comprise any suitable controller and can include one or more processors and any suitable storage or memory elements for storing selected operational instructions that can be executed. The control unit can communicate with a separate computing apparatus or can comprise a portion of the computing apparatus depending upon the specific application and configuration of the system. The computing apparatus allows a system operator to communicate with the system and to provide real time or pre-stored operating instructions. Those of ordinary skill in the art will readily recognize that the control unit 44 can regulate one or more parameters of the reciprocating motor or the air control unit. For example, the control unit can adjust or vary during operation of the system and in real time the reciprocation frequency of the motor and hence of the blade element 16, as well as the length of the reciprocating stroke of the blade unit. The air control unit 46 can be any suitable air supply device that is capable of controlling, varying or regulating the amount of air delivered to the reciprocating motor 42 based on or in response to an output control signal from the control unit 44. The air control unit can be for example a compressor or a proportional air valve.

In one preferred practice of the invention, the blade unit 20 has a blade element mounted for reciprocating movement transverse to the sweep direction and employs a reciprocating motor 42, separate from the sweep drive 24, for such reciprocation. The control unit 44 synchronizes the action of the reciprocating motor with that of the sweep drive during the material-applying sweep. In addition, the control unit 44 can selectively regulate one or more parameters of the reciprocation movement, such as the frequency of reciprocation and the length of the reciprocation stroke. Various reciprocating frequencies and reciprocating stroke lengths are suitable for practicing this invention. Generally, it is desirable for the length of the reciprocation stroke to vary between about 0.1 mm and about 2.0 mm and for the frequency of reciprocation of the reciprocating motor 42 to vary between about 5 Hz and about 200 Hz. Appropriate reciprocating frequencies and stroke lengths may be selected by analyzing, among other factors, the mass of the blade element, the size of particulates contained in the mounting material, the dimensions of apertures in the mask, and the sweep rate.

Depending on the particular application, a blade element according to this invention may vary in shape and angle of contact with the surface. In addition, the blade element can be composed of either a resilient material, such as a durable metal, or a flexible material, such as a plastic or other elastomeric compound. Flexible blade elements utilized may have high or low durometer ratings. Unlike prior systems, the invention advantageously can be used to produce high fidelity prints with low durometer blade elements. The reciprocating motion, as disclosed herein, allows mounting material to be applied with high fidelity without applying high pressure to the low durometer blade element, thus significantly reducing the scavenging generally associated with low durometer blades.

Under certain conditions, it is preferable that the blade element 16 reverse direction over every aperture in mask 14 at least once to increase shear stress. To guarantee that the blade element 16 reverses direction over each aperture, the blade element 16 can complete at least one period of reciprocating motion along direction 40 before the sweep arm 19 moves a selected distance along the sweep direction 22 that is equal to the length of the smallest aperture in the mask 14 along direction 22. Alternatively, because the frequency of a periodic motion equals the reciprocal of the periodic length, to guarantee the reversal of the blade element 16 the frequency of reciprocation must equal or exceed the velocity of the sweep arm 19 divided by the length of the smallest aperture. In mathematical terms, the preferred frequency of oscillation, F, for the blade element 16 is generally greater than the speed of the sweep arm "$V_D$" divided by the distance "d" across the smallest aperture along the sweep direction 22.

The control unit 44 preferably operates the air control unit 46 to limit transverse movement of the blade unit 20 only during a material-applying sweep of the blade element 16. In response to this vibrational energy, the blade holder 52 moves transversely, in the direction of arrow 40, during the material-applying sweep. The compressed reciprocation springs 54 of the blade holder 52 provide a restoring force which counteracts the vibrational energy of the reciprocating motor 42 and tends to drive the blade holder 52 back to a center position after each transverse movement off the center axis. Thus, the restoring forces generated by the reciprocation springs 54, when combined with the vibrational energy of the reciprocating motor 42, drives the transverse reciprocating motion of the blade holder 52.

The shape of the blade element 16 and the angle of the blade contact with the apertured mask 14 can be selected, following practices known in the art. For example, FIG. 4 shows the blade element 16 during a material supplying sweep where the blade 16 is held in a plane perpendicular to the surface of the apertured mask 14. In this embodiment, however, the lower portions of the sides of the blade element 16 are beveled such that the blade 16 has an edge which contacts the surface of the apertured mask 14. As the blade element 16 sweeps across the apertured mask 14 in the direction of the sweep arrow 22, the blade element 16 reciprocates back and forth in a direction transverse to the arrow 22 and deposits the mounting material 48 through the apertures of the mask 14 onto the surface mount pads (not shown) of the circuit board 12. The reciprocation of the blade element 16 transverse to the sweep direction shown by the arrow 22 is understood to cause the blade element 16 to subject the mounting material 48 to shear stress in addition to that produced by the sweep movement. Further, the vibrational energy produced by the reciprocating motor is believed to excite the conductive material on a molecular level and reduce its cohesive bond, thus causing the material to roll freely. The reduction of the cohesive bond in the printed material also extends its functional service life as it begins to dry. This in essence also allows the use of high viscosity materials that may otherwise have been deemed unsuitable for use in the circuit board manufacturing system of the present invention. The blade unit 20 when vibrated further serves to break down any adhesive forces that may exist between the blade and the material. As such, when the blade forces the material over an aperture of the mask, the reduced adhesive forces significantly reduce the likelihood that the material will be inadvertently dragged (i.e., scavenged) out of the apertures by the blade. This hence enhances the deposition of the material, with exceeding fidelity, onto the circuit board through all apertures of the mask.

The illustrated circuit board manufacturing machine 10, as shown in FIG. 1, applies the mounting material 48 through an apertured mask 14 to a circuit board 12, or other substantially flat circuit element, with high resolution using a blade element 16 which reciprocates transverse to the sweep direction 22, during a material-applying sweep. The circuit board manufacturing machine 10 applies the mounting material 48 with high fidelity and minimum voids to locations corresponding to the surface mounted pads on the circuit board 12, held in selected and precise registration with the apertured mask 14. The reciprocation rate and the length of the reciprocation stroke are regulated by a control unit 44, which preferably also synchronizes the reciprocating movement of the blade element 16 with the sweeping action of the sweep arm 19.

In operation, the apertured mask 14 and the circuit board 12 are placed in the frame sections 18A and 18B. The registration drive 38 selectively provides precision movement of one frame section relative to the other to align the circuit board 12 precisely with, and in abutment with, the apertured mask 14. This selected registration between the circuit board 12 and the apertured mask 14 is such that the mounting material 48, and preferably a conductive mounting material suitable for use in the current application, is applied during a material-applying sweep of the blade element 16 through the mask apertures to locations on the circuit board 12 corresponding to surface mount pads.

The sweep drive motor 24 is then actuated to move the blade unit in the sweep direction 22. The reciprocating motor 42 is also actuated so as to vibrate the blade element 16 during the sweep process. The mounting material 48 is dispensed and the vibrating blade element 16 applies the mounting material to the circuit board through the mask. The vibration detector 80 detects vibrational movement of the blade element or some other components of the blade unit. The vibration detector 80 is coupled to the control unit 44 and hence the control unit receives and processes the output signals of the vibration detector 80. The control unit then generates a control signal that is received by a regulating device, such as the air control unit 46. Depending upon the type of reciprocating motor 42 that is used, the control unit can directly communicate with the reciprocating motor to vary, adjust or regulate one or more parameters of the motor. Alternatively, the control unit can communicate with an intermediate regulating device which in turn serves to regulate the reciprocating motor 42.

According to one embodiment of the present invention, the control unit 44 generates a control signal that is received by an intermediate regulating device. The control signal can serve to regulate, vary or adjust one or more parameters of the regulating device. The regulating device can comprise for example an air control unit 46. In response to a selected input signal, the air control device can generate an output signal that is transmitted to the reciprocating motor. The output signal can correspond for example to an air pressure value that corresponds to the control signal. The air control unit 46 can thus regulate, vary or adjust one or more input parameters, such as air pressure, of the reciprocating motor. In response, the reciprocating motor can adjust one or more output parameters, such as the frequency of vibrations of the motor.

This control scheme allows the system 10 to vary or adjust the reciprocating motor in real time during the sweep process so as to apply the mounting material with high fidelity.

The described invention may be used in semi-automated systems requiring an operator, or alteratively in fully automated systems wherein machines perform all functions. For example, in a semi-automated system, an operator can manually load mask 14 and circuit board 12 into the frame sections, align the apertures in mask 14 with the desired locations on circuit board 12, and then initiate the machine controlled movement of blade element 16. Comparatively, in a fully automated system, machines control the loading and aligning of mask 14 and circuit board 12, and the movement of blade element 16.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

We claim:

1. A printed circuit manufacturing system for applying a mounting material to a substrate, the system comprising
    a blade unit having a blade element elongated along a first axis and having a thickness along a transverse second axis and selectively movable along at least each of the first and second axes, wherein the blade element, during such movement along the second axis, transfers the mounting material to the substrate,
    a reciprocating motor coupled to the blade unit for reciprocating the blade element along the first axis concurrent with movement of the blade element along the second axis,
    a vibration detector coupled to the blade unit for detecting a vibrational movement of the blade element, wherein the vibration detector generates an output signal corresponding to the vibrational movement of the blade element,
    an air control unit coupled to the reciprocating motor for adjusting an amount of air pressure supplied to the motor, and
    a control unit coupled to the vibration detector and to the air control unit for generating an output signal in response to the output signal of the vibration detector to control the air control unit,
    wherein the vibration detector, the control unit and the air control unit form a feedback system, and the air control unit in response to the output signal of the control unit adjusts a frequency of vibration of the reciprocating motor by controlling the air pressure supplied to the reciprocating motor.

2. The system of claim 1, wherein the blade unit further comprises
    a non-reciprocating bearing mount coupled to a sweep arm,
    a reciprocating blade holder coupled to the bearing mount and to the blade element, and
    a bearing assembly mounting said reciprocating blade holder to the bearing mount by providing relative movement therebetween along the first axis.

3. The system of claim 1, wherein the vibration detector comprises an accelerometer.

4. The system of claim 1, wherein the air control unit comprises a proportional air valve.

5. The system of claim 1, wherein the reciprocating motor comprises a pneumatic vibrator, a pneumatic transducer, a piezoelectric actuator, or an electric motor.

6. A manufacturing system for applying a mounting material to a workpiece, the system comprising
    a blade unit having a blade element elongated along a first axis and having a thickness along a transverse second axis and selectively movable along at least each of the first and second axes, wherein the blade element, during such movement along the second axis, transfers the mounting material to the workpiece,
    a reciprocating motor coupled to the blade unit for reciprocating the blade element along the first axis concurrent with movement of the blade element along the second axis,
    a vibration detector coupled to the blade unit for detecting a vibrational movement of the blade element, wherein the vibration detector generates an output signal corresponding to the vibrational movement of the blade element,
    a control unit coupled to the vibration detector for generating an output signal in response to the output signal of the vibration detector, and
    a regulating device coupled to the reciprocating motor and to the control unit for adjusting a parameter of the reciprocating motor in response to the output signal of the control unit.

7. The system of claim 6, wherein the mounting material is a conductive extrudable mounting material.

8. The system of claim 6, wherein the workpiece is a printed circuit board.

9. The system of claim 6, wherein the control unit generates the output signal in accordance with a set of pre-stored instructions.

10. The system of claim 6, wherein the reciprocating motor comprises a pneumatic vibrator, a pneumatic transducer, a piezoelectric actuator, or an electric motor.

11. The system of claim 6, wherein the vibration detector comprises an accelerometer.

12. The system of claim 6, wherein the parameter of the reciprocating motor adjusted by the control unit comprises a frequency of vibration or amplitude of vibration.

13. The system of claim 6, wherein the regulating device comprises an air control unit for adjusting the amount of air pressure supplied to the reciprocating motor.

14. The system of claim 13, wherein the air control unit in response to the output signal of the control unit adjusts a frequency of vibration of the reciprocating motor by controlling the air pressure supplied to the reciprocating motor.

15. A method for applying a mounting material to a substrate, the method comprising
    providing a blade unit having a blade element elongated along a first axis and having a thickness along a transverse second axis and selectively movable along at least each of the first and second axes, wherein the blade element, during such movement along the second axis, transfers the mounting material to the substrate,
    reciprocating the blade element along the first axis via a reciprocating motor concurrent with movement of the blade element along the second axis,
    detecting a vibrational movement of the blade element via a vibration detector and generating a vibrational output signal corresponding to the vibrational movement of the blade element,
    generating, with a control unit, a control output signal in response to the output signal of the vibration detector, and
    adjusting, with a regulating device, a parameter of the reciprocating motor in response to the control output signal.

16. The method of claim 15, further comprising generating the control output signal in accordance with a set of pre-stored instructions.

17. The method of claim 15, wherein the parameter of the reciprocating motor comprises a frequency of vibration or amplitude of vibration.

18. The method of claim 15, wherein the adjusting step is performed by the regulating device coupled to the reciprocating motor.

19. The method of claim 18, wherein the regulating device comprises an air control unit for adjusting the amount of air pressure supplied to the reciprocating motor.

20. The method of claim 19, wherein the air control unit in response to the control output signal generated by the control unit adjusts a frequency of vibration of the reciprocating motor by controlling the air pressure supplied to the reciprocating motor.

* * * * *